(12) United States Patent
Rotta et al.

(10) Patent No.: US 6,914,781 B2
(45) Date of Patent: Jul. 5, 2005

(54) FIXTURE AND METHOD FOR QUICK INSTALLATION AND REMOVAL OF MOBILE PLATFORM ELECTRONIC MODULES

(75) Inventors: Phillip R. Rotta, Kirkland, WA (US); John G. MacDuff, Jr., Issaquah, WA (US); Phillip E. Roll, Kent, WA (US)

(73) Assignee: The Boeing Company, Chicago, IL (US)

( * ) Notice: Subject to any disclaimer, the term of this patent is extended or adjusted under 35 U.S.C. 154(b) by 74 days.

(21) Appl. No.: 10/423,800

(22) Filed: Apr. 25, 2003

(65) Prior Publication Data

US 2004/0212959 A1 Oct. 28, 2004

(51) Int. Cl.[7] .................................................. H05K 7/20
(52) U.S. Cl. ....................... 361/690; 165/80.3; 361/694; 361/695; 454/184
(58) Field of Search ................... 165/80.3, 121–122; 361/688–695, 725–727, 831; 454/184

(56) References Cited

U.S. PATENT DOCUMENTS

| | | | |
|---|---|---|---|
| 538,145 A | 4/1895 | Allen | |
| 1,724,806 A | 8/1929 | Ryder | |
| 3,026,516 A | 3/1962 | Davis | |
| 3,541,395 A | 11/1970 | Lucchino | |
| 3,553,732 A | 1/1971 | Glynn | |
| 3,971,476 A | 7/1976 | Konstant | |
| 4,089,040 A | 5/1978 | Paulsen | |
| 4,133,507 A | 1/1979 | Chervenak | |
| 4,483,499 A | 11/1984 | Fronk | |
| 4,504,030 A | * 3/1985 | Kniat et al. | .................... 244/57 |
| 4,635,067 A | 1/1987 | Fitzpatrick | |
| 4,648,570 A | 3/1987 | Abdelmaseh et al. | |
| 4,674,704 A | * 6/1987 | Altoz et al. | ................. 244/1 R |
| 5,050,832 A | 9/1991 | Lee et al. | |
| 5,414,435 A | 5/1995 | Wolf | |
| 5,526,235 A | 6/1996 | Beason et al. | |
| 5,549,258 A | 8/1996 | Hart et al. | |
| 5,621,387 A | 4/1997 | Phillips et al. | |
| 5,716,027 A | 2/1998 | Hart et al. | |
| 5,810,178 A | 9/1998 | Boette et al. | |
| 5,907,476 A | 5/1999 | Davidsz | |
| 6,120,000 A | 9/2000 | Aeschbach et al. | |
| 6,513,755 B1 | 2/2003 | Lambiaso | |
| 6,527,227 B1 | 3/2003 | Lambias | |
| 6,567,267 B1 | * 5/2003 | Wang | ......................... 361/695 |

FOREIGN PATENT DOCUMENTS

| | | |
|---|---|---|
| GB | 2215135 A | 9/1989 |
| JP | 56031202 | 3/1981 |

* cited by examiner

Primary Examiner—Gregory Thompson
(74) Attorney, Agent, or Firm—Harness Dickey & Pierce P.L.C.

(57) ABSTRACT

A fixture for supporting an electronics module or like component in a generally inaccessible area within a structure. In one preferred form the fixture is adapted to be mounted within a fuselage of an aircraft or other mobile platform in an area that would not permit direct removal of an electronics module for maintenance or repair without first removing other aircraft subsystems, tubing or ducting. The fixture allows the electronics module to be slidably inserted and supported in an area in a manner that allows easy installation and removal of the electronics module without the need to remove other subcomponents disposed adjacent the fixture. The fixture includes provisions for coupling of an air supply thereto such that the electronics module can be cooled. The fixture is lightweight, compact and can be secured in a wide variety of orientations and locations within an aircraft or other structure to make most efficient use of the limited available space in commercial aircraft and other structures.

22 Claims, 3 Drawing Sheets

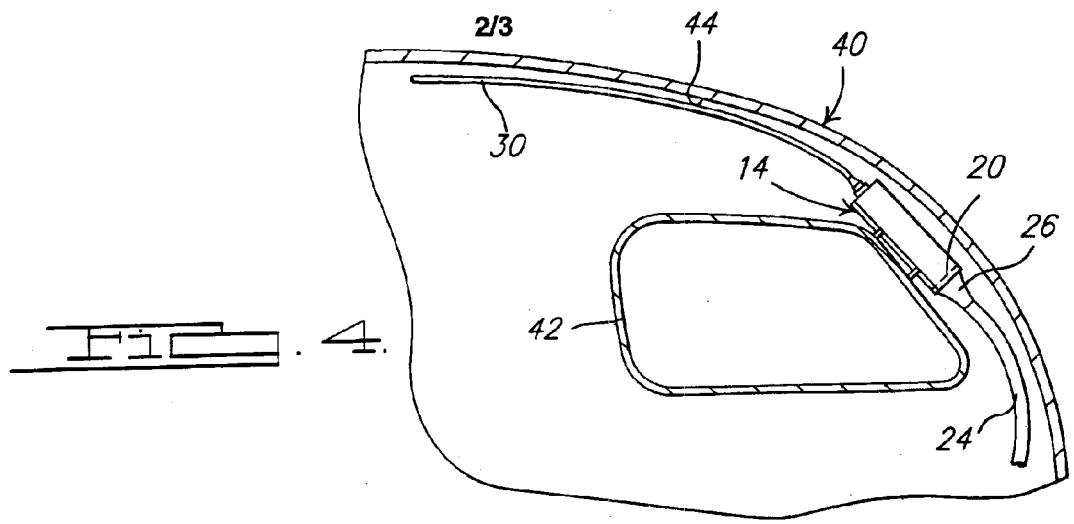
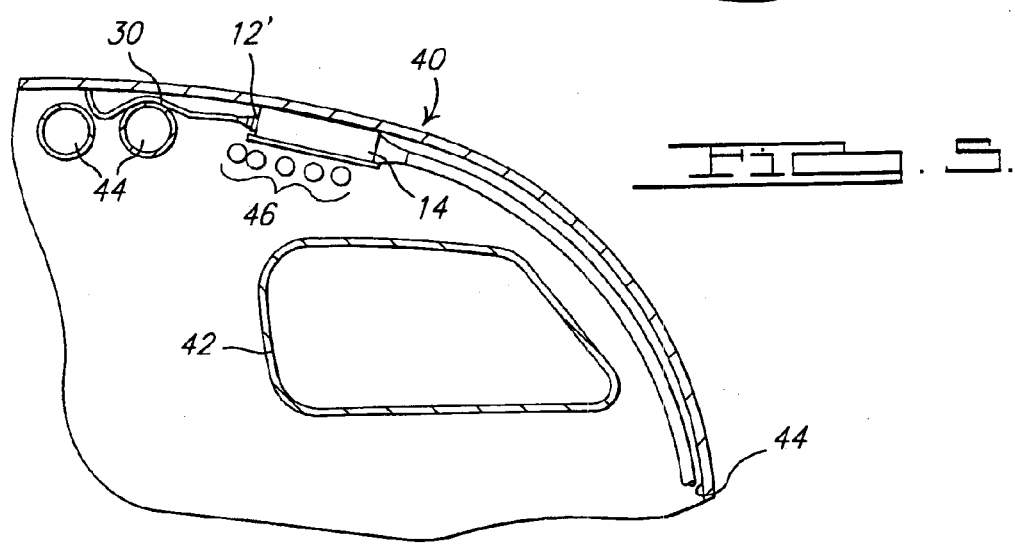
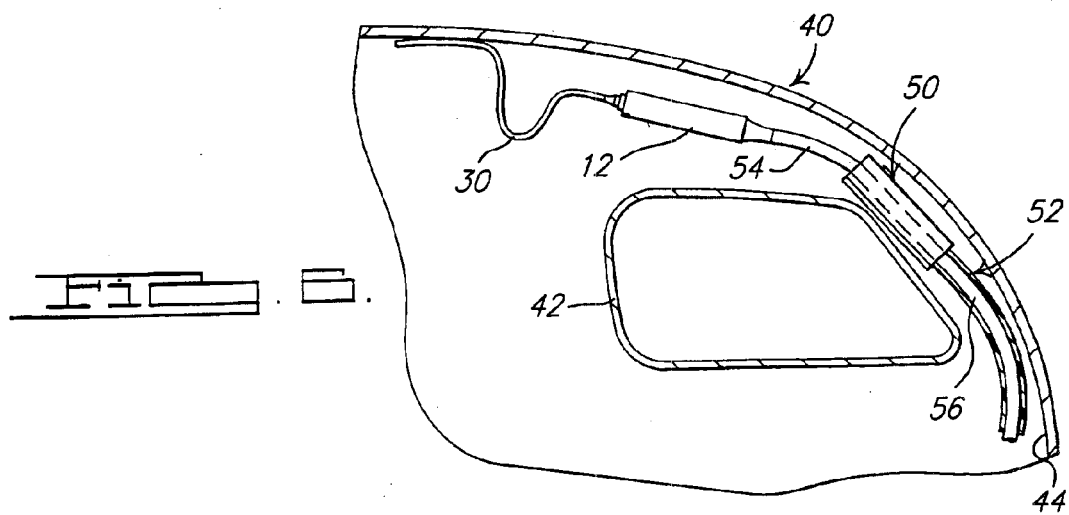

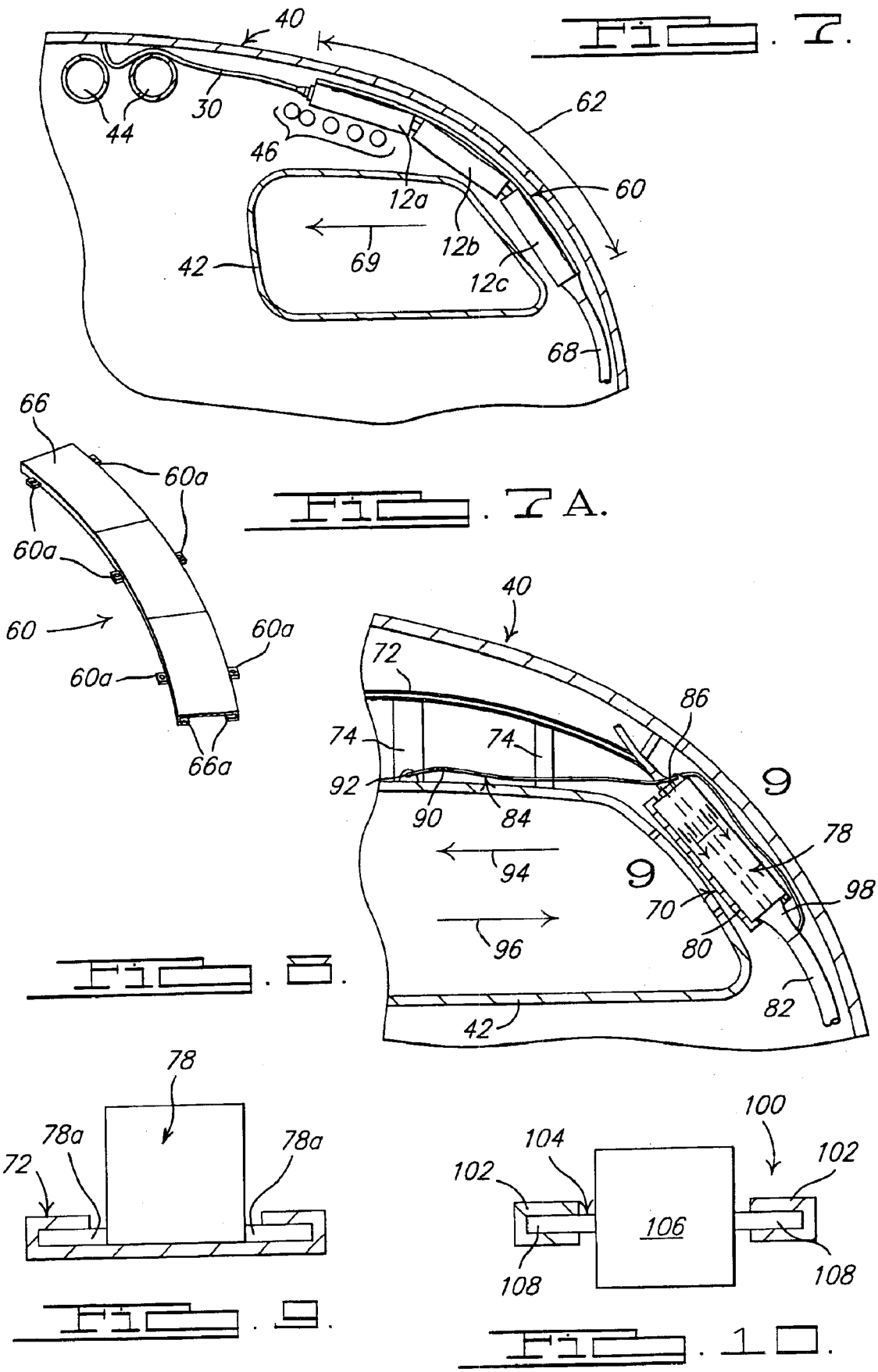

FIXTURE AND METHOD FOR QUICK INSTALLATION AND REMOVAL OF MOBILE PLATFORM ELECTRONIC MODULES

FIELD OF THE INVENTION

The present invention relates to fixtures for supporting electronic modules, and more particularly to a fixture for supporting an electronic module in a manner that allows the module to be quickly and easily removed from spaces within a mobile platform that would otherwise be inaccessible or difficult to access by a worker.

BACKGROUND OF THE INVENTION

Present day communication systems used on mobile platforms, and in particular on aircraft, often require multiple electronic modules (i.e., units) to be installed in close physical proximity to other subsystems used on the aircraft. This is particularly true when the electronic units are used in connection with an antenna and/or radio frequency communication system employed on the aircraft. The location of such electronic units in close physical proximity to an antenna mounted on the aircraft is often critical to meet predetermined radio frequency performance requirements. The placement of electronic modules in certain areas of the aircraft may also be dictated by aircraft dynamics or other technical constraints.

In the case of single aisle aircraft, space may be quite limited in the crown area of the aircraft inside the fuselage, just below where the antenna may be mounted. This space can be limited due to high ceiling interiors that leave little space between the top of the ceiling panels and the aircraft fuselage. Typically, this limited space is already quite crowded with existing aircraft systems such as air ducts, power cables, signal cables, control cables and other various conduits necessary for controlling the wide ranging and numerous subsystems typically employed on a commercial aircraft.

In addition to the space limitations on single aisle aircraft described above, there is a trend to use overhead space in twin aisle aircraft for purposes of crew rest quarters or for other storage needs. Thus, the use of this space for these functions further reduces the use of such space for the installation of systems such as inflight entertainment equipment and other electronic components. Thus, the areas within a commercial aircraft where an electronic module can be located where it will be easily accessible without the need to first remove other subsystems, conduits or cabling, can be very limited.

With commercial aircraft applications, still another area where space exists for the installation of electronics units is adjacent the aircraft frame behind the overhead passenger luggage bins. However, access to this space typically requires removal of the luggage bins, which can be very time consuming and expensive. Removal of the passenger luggage bins, simply to gain access to one or more electronic units, is often not a viable option in view of the time and expense needed to remove and reinstall such luggage bins.

The need to remove various aircraft subsystems, conduits, cabling or other components before being able to remove an electronic unit for periodic service, maintenance or repair can significantly add to the time and cost required to perform such maintenance, service or repair work. Removal of existing aircraft subsystems, cables, duct work or hoses before being able to access an electronic unit can result in significant time consuming, costly and complex re-installation procedures. Furthermore, once an aircraft subsystem is removed in order to gain access to an electronic module, the aircraft subsystem often needs to be retested once it is reinstalled. Often times, the removal of such subsystems is necessary because attempted removal of the electronic unit without first removing other subsystems, cables or duct work, which is in the way of access to the electronic module, can easily result in damage to the subsystem, cables or other elements if same are not first removed. Likewise, periodic removal and replacement of existing aircraft systems can result in damage to the existing aircraft systems resulting in the need for time consuming and costly repair of existing systems before an aircraft can be returned to service.

It will also be appreciated that in many applications, and particularly in commercial aircraft maintenance and repair work, the ability to quickly remove electronic units from an aircraft is crucial to minimizing down time of the aircraft and ensuring that the aircraft returns to service as quickly as possible.

Similar constraints apply to other mobile platforms such as business aircraft, all types of military aircraft, submarines and other marine vessels. Often the space constraints on these other mobile platforms are even more serious and available space is even harder to access.

In view of the foregoing there is a need for an apparatus that enables quick and easy removal and replacement of an electronic unit within a difficult to access area of a structure. In particular, there is a need for such an apparatus which can be easily used within a mobile platform, for example, an aircraft, and which permits an electronic module supported on the apparatus to be quickly and easily removed from otherwise inaccessible areas without the need to first remove other various subsystems, conduits, cables or control elements typically located within an aircraft.

SUMMARY OF THE INVENTION

The present invention is directed to an apparatus and method for supporting a subcomponent in a manner that allows the subcomponent to be quickly and easily removed from an area within a structure, where the subcomponent would otherwise be difficult or impossible to access by a worker without removal of other additional significant components before removal of the subcomponent. In one preferred form the apparatus comprises a fixture which is fixedly mounted to an interior wall or frame of the structure. Merely by way of example, the structure may comprise a commercial aircraft, although it will be appreciated that any fixed structure or other mobile platform would benefit from the use of the apparatus of the present invention, provided such structure or mobile platform requires removal of one or more important subcomponents for periodic maintenance, repair or testing, where such subcomponents may be located in congested areas which make access difficult.

In one preferred form the apparatus of the present invention comprises a fixture having a frame onto which the subcomponent may be disposed. One preferred embodiment allows for the insertion of the subcomponent, which comprises an electronics module, into the frame. The frame includes one or more components that allow it to be fixedly secured to a frame like portion of the structure or mobile platform. The frame allows for an external cable, such as an electrical cable, to be coupled to the electronics module. In one preferred form the frame also allows for an external cooling supply conduit to be coupled to the electronics module to supply cooling airflow to the electronics module.

It is a principal advantage of the present invention that the fixture allows insertion and supporting of the electronics module without the need to remove additional structure or components which may otherwise impede direct removal of the electronics module. Thus, the fixture allows the electronics module to be inserted or removed quickly and easily from the frame thereof, thus obviating the need to remove other components that would be necessary in order to remove the electronics unit were it to be supported directly from a frame of the structure or mobile platform.

In alternative preferred embodiments the apparatus further comprises a track upon which the subcomponent (e.g., electronics module) can be moved along into a very tight, confined area that is otherwise impossible to access with one or more hands of the user. A tether coupled to the electronics module allows it to be guided into and out of the frame of the apparatus.

In yet another preferred embodiment the frame of the apparatus is sufficiently large to accommodate a plurality of subcomponents (e.g., electronic modules) disposed adjacent one another within the frame. Each of the preferred embodiments of the present invention enable a subcomponent, e.g. an electronics module, to be quickly and easily removed from a very confined area where removal would otherwise necessitate first removing various other subcomponents, conduits or tubing before the user would actually be able to have sufficient access to the subcomponent to remove same directly from the structure to which it is supported. The present invention thus significantly reduces the time needed to remove and replace various electronic modules, which often need to be periodically removed, tested and then reinstalled on a mobile platform, such as a commercial aircraft.

Further areas of applicability of the present invention will become apparent from the detailed description provided hereinafter. It should be understood that the detailed description and specific examples are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 4 shows the electronic module shown in FIG. 3 installed in the frame of the fixture without the need to first remove the luggage bin;

FIG. 5 illustrates an alternative preferred mounting location for the fixture above wiring and tubing in the crown area of a commercial aircraft;

FIG. 6 illustrates an alternative preferred form of the fixture of the present invention wherein a telescoping cooling conduit is employed with an electronics module;

FIG. 7 illustrates an alternative preferred form of the present invention wherein the fixture has a length sufficient to support a plurality of independent modules therein adjacent one another;

FIG. 7A is a simplified perspective view of the fixture of FIG. 7;

FIG. 8 illustrates an alternative preferred embodiment of the fixture of the present invention wherein a guide track and a tether are employed for aiding insertion and removal of an electronics module;

FIG. 9 illustrates a cross sectional end view of the guide track shown in FIG. 8 in accordance with section line 9—9 in FIG. 8 and FIG. 10 illustrates a cross sectional end view, similar to FIG. 9, of an alternative preferred form of the guide track of FIG. 8.

DETAILED DESCRIPTION OF THE PREFERRED EMBODIMENTS

The following description of the preferred embodiment(s) is merely exemplary in nature and is in no way intended to limit the invention, its application, or uses.

Figure 1:
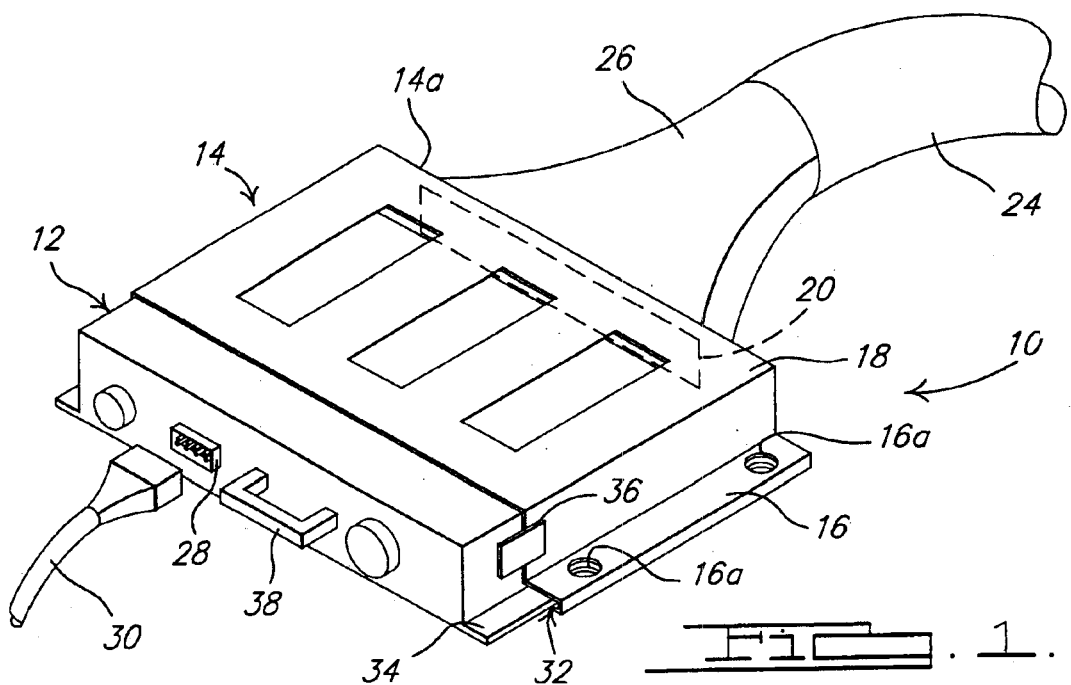
FIG. 1 is a perspective view of a fixture in accordance with a preferred embodiment of the present invention with an electronics module inserted into the fixture.

Referring to FIG. 1, there is shown an apparatus 10 in accordance with a preferred embodiment of the present invention. The apparatus 10 essentially forms a fixture to which a subcomponent, for example an electronics module 12, can be coupled to and supported from. As will be described in the following paragraphs, the fixture 10 is supported from a structure or frame in an area that would be generally inaccessible to a worker without the need to first remove various other components to gain access to the electronics module 12. For example, the fixture 10 could be located to an interior structural wall of a mobile platform such as an aircraft where access would generally be limited because of other aircraft subsystems, conduits, tubing or other structural elements that would impede access to the module 12. Thus, the fixture 10 forms a means by which the module 12 can be quickly and easily removed by a worker without the need to first remove other subsystems, cabling, conduits, etc. to permit removal and re-installation of the module 12 into the fixture 10.

Throughout the following discussion, the subcomponent 12 will be referred to as the "electronics module" 12. However, it will be appreciated the fixture 10 is not limited to use with only an electronics module. The electronics module 12, as will be appreciated by those skilled in the art, could comprise any type of electrical or electromechanical subsystem or component that may need to be periodically removed for maintenance, repair, testing, etc., from an area of a fixed structured or a mobile platform where access would be difficult without first removing various other components in the vicinity of the module 12.

With further reference to FIG. 1, the fixture 10 comprises a frame 14 forming a generally box-like structure into which the electronics module 12 is inserted. The frame 14 includes one or more flanges or components 16 which allow the frame 14 to be secured to a structural wall or other structural element via one or more brackets or like elements in a desired location within a fixed structure or mobile platform. Each flange 16 preferably includes at least one over-sized opening 16a through which an external fastening element may be inserted. In this manner the weight of the module 12 can be supported directly from the structure to which the fixture 10 is secured. The frame 14 further includes a rear portion 18 to which a gasket 20 is secured. The gasket 20 is adapted to matingly engage an opening, or potentially a flange, associated with the electronics module 12 such that a cooling airflow can be supplied through a conduit 24 and a manifold 26 to help cool an interior area of the electronics module 12. It is anticipated that the electronics module 12 will in most instances include a connector or other coupling element 28 to which a suitable electrical cable 30 can be releasably coupled. Thus, insertion of the electronics module 12 within the frame 14 allows essentially an automatic coupling of the air flow conduit 24 to the opening of the electronics module 12. It will be appreciated immediately, however, that the airflow conduit 24, manifold 26 and gasket 20 are not essential to the functioning to the fixture 10. Components 18, 20, 24 and 26 are illustrated merely to highlight the advantage that the frame 14 provides should it be necessary to provide a cooling airflow to the electronics module 12. Alternatively, end portion 14a of the frame 14 may merely comprise an opening through which a user can manually couple a suitable airflow conduit (or alternatively another electrical cable) to the electronics module 12 if such access is available to the user.

Referring further to FIG. 1, the frame 14 also preferably includes at least one channel, and more preferably a pair of channels 32 (only one being visible in FIG. 1) into which flanges 34 of the electronics module 12 can slide. However, again, it will be appreciated that while this feature enhances alignment of the electronics module 12 with the frame 14, this feature is not absolutely essential to the functioning of the frame 14. Instead, electronics module 12 could be adapted to simply be lowered or raised, or otherwise slid into, the frame 14. The use of channels 32 and flanges 34, however, serves to help the user align and guide the module 12 into the frame 14.

Figure 2:
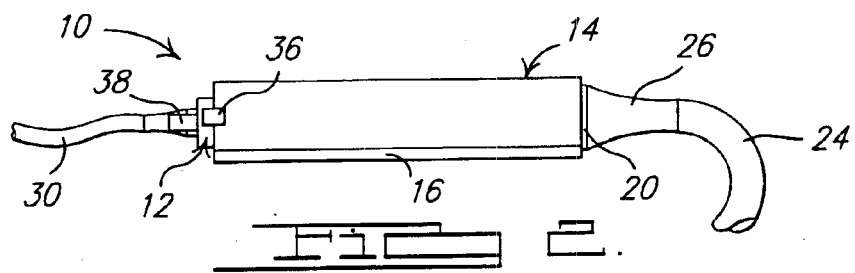
FIG. 2 is a side elevational view of the electronics module of FIG. 1 installed within the fixture frame.

The frame 14 further preferably includes a suitable latch 36 which can be moved between an open position, wherein the electronic module 12 can be slid into the frame, as shown in FIG. 1, and a closed position in which the latch overlies a portion of the electronics module 12 and prevents ready removal of the module from the frame 14. To aid insertion and removal of the electronics module 12, it will be appreciated that this component could include a handle 38 or another suitable member to aid the user in grasping and controlling the module 12 as it is removed or installed relative to the frame 14. The module 12 is shown installed in the frame in FIG. 2.

Figure 3:
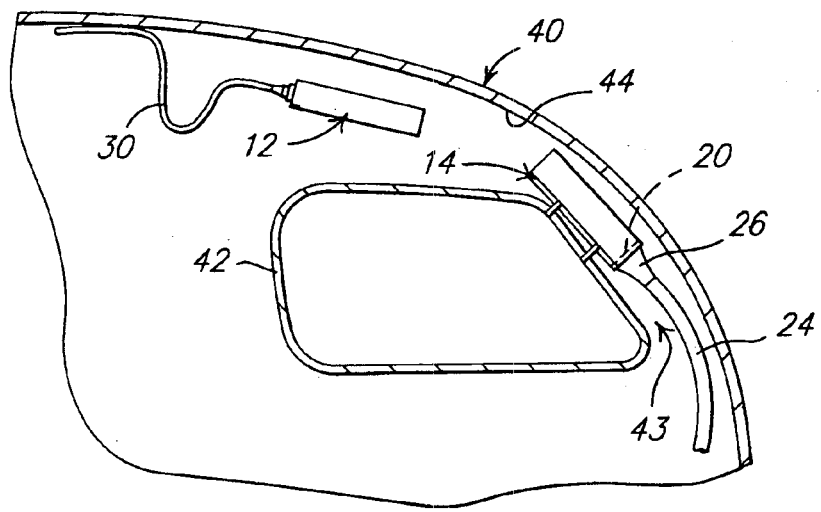
FIG. 3 is a simplified side view of the fixture installed behind a luggage bin in a commercial aircraft.

Referring to FIG. 3, the electronics module 12 is shown within an aircraft fuselage 40. In this example, a luggage bin 42 would otherwise impede access to the area that the electronics module 12 is preferably located, that area being designated by reference numeral 43. The frame 14 of the fixture 10 is first secured to either an outer surface of the luggage bin 42 or an interior surface 44 of the fuselage 44 in an area generally behind the luggage bin 42. The electrical cabling 30 is then secured to the electronics module 12. A maintenance worker, technician, etc. then manually guides the electronics module 12 into the frame 14 where it automatically engages with the gasket 20 (FIG. 1). Thus, a cooling airflow can be provided through conduit 24 into the module 12, as well as the needed electrical signals via electrical cable 30. Most importantly, the worker is not required to first remove the luggage bin 42 to gain direct access to the electronics module 12. The fixture 14 allows the worker to insert the electronics module merely by guiding it behind the luggage bin 42, and even where the frame 14 is mostly obscured by the luggage bin 42.

It will also be appreciated that while the electrical cabling 30 and the conduit 24 have been shown as independent components, that suitable cabling and conduits could be coupled within a common sheath or housing such that both electrical and airflow connections are made with the electronics unit 12 before the electronics module 12 is inserted into the frame 14. Alternatively, the use of the airflow conduit 24 can be omitted entirely. FIG. 4 shows the electronics module 12 installed within the fixture 10.

Referring to FIG. 5, an alternative preferred mounting location for the apparatus 10 of the present invention is shown partially above the luggage bin 42. In this example the electrical cable 30 is routed around existing aircraft cabling and duct work 44. Still further, other aircraft subsystems such as tubing and ducting 46, which would otherwise impede removal and insertion of an electronics module 12', still does not pose an obstacle to removal of the module 12'. In this example, the electronics module 12' has coupled to it the electronics cable 30 at one end and the cooling airflow conduit 24 at the other end. To remove the module 12' the electronics cable 30 and cooling airflow cable 24 are each uncoupled from the module 12'. The module is then moved initially to the right in the drawing of FIG. 5, and then below the ducting 46 to the left. In aircraft applications, it will also be appreciated that standard plug-like components, such as ARINC 600 connectors, can be employed for facilitating the electrical and/or cooling connections if desired. Regardless of the specific type of connectors employed for the purpose of supplying electrical signals, electrical power or a cooling airflow to the electronics module 12', insertion and removal of the module from the apparatus 10 is not impeded by the components 44 and 46 disposed in close proximity to the frame 14 of the fixture 10.

Referring now to FIG. 6, a fixture 50 in accordance with an alternative preferred embodiment of the present invention is shown. Fixture 50 is essentially identical to fixture 10 with the exception that the fixture 50 includes a telescoping cooling interface 52 which receives a first portion 54 of a cooling conduit and places portion 54 in airflow communication with a second airflow conduit 56. Instead of a telescoping interface, however, a telescoping electrical cable-like structure could just as readily be employed. Thus, as electronics module 12 is removed from the fixture 50, first conduit portion 54 is withdrawn from portion 56. When the module 12 is reattached to the fixture 50, first conduit portion 54 is telescopically engaged within second conduit portion 56. Electrical cabling 30 is also removably coupled to the electronics module 12. With this embodiment, the electronics module 12 can be easily withdrawn from an area generally behind the luggage bin 42 within the fuselage 40 of an aircraft. The first conduit portion 54 can be constructed such that it can only be removed from the second conduit portion 56 a limited amount or, alternatively, such that it can be removed from second conduit portion 56 entirely.

Referring now to FIGS. 7 and 7A, a fixture 60 in accordance with yet another alternative preferred embodiment of the present invention is shown. Fixture 60 has a length, designated by arrow 62, which is sufficient to hold a plurality of electronic modules 12a, 12b, 12c adjacent one another. It will be appreciated that each electronics module 12a, 12b and 12c needs to include a suitable interface such that electrical signals and/or power from cabling 30 can be supplied from a first one of the electronic units 12a successively to the second and third electronics modules 12b and 12c. The construction of the fixture 60 is otherwise similar to fixture 10 and includes flanges 60a or other mounting components 64 for enabling a frame 66 of the fixture 60 to be secured to a structural member, wall, etc. as needed. The frame 66 includes a pair of flanges 66a that receive the modules 12a, 12b and 12c. In this example the majority of the fixture 60 is disposed behind the luggage bin 42 and the modules 12a, 12b and 12c would be difficult, if not impossible, to remove directly without first removing the entire luggage bin 42, without use of the fixture 60. The modules 12a–12c are removed along a path designated by arrow 69. It will also be appreciated that with the fixture 60, a supply of cooling airflow from a cooling airflow conduit 68 can be directed around each of the electronic modules 12a, 12b and 12c or alternatively, if suitable interfaces are provided, through interior portions of each of the electronic modules 12a–12c. Alternatively, cooling airflow conduit 68 could comprise another electrical cable for coupling with a rear mounted connector on the module 12c.

Referring now to FIG. 8, a fixture 70 in accordance with yet another alternative preferred embodiment of the present invention is shown. In this embodiment a track 72 is coupled to supports 74 associated with the luggage bin 42 or with the fuselage 40 of the aircraft.

Referring briefly to FIG. 8 and FIG. 9, the track 72 can be seen in greater detail as comprising two facing U-shaped portions which are adapted to engage with two oppositely extending flanges 78a formed on an electronics module 78. The track 72 serves to guide the electronics module 78 towards a frame 80 of the fixture 70. In this regard it will be appreciated that the track 72 preferably extends within an interior area of the fixture 70. As such, the fixture 70, which is otherwise substantially identical in construction to fixture 10, does not require the channels 32 described in connection with fixture 10. Fixture 70 may also include an airflow supply conduit 82 coupled to the frame 80 for supplying a cooling airflow into the fixture 70. Importantly, a tether or other form of cabling 84 is provided that is attached at a first end 86 to attachment structure 88 on the electronics module 78, and at a second end 90 to a permanent attachment point 92 associated either with the luggage bin 42 or with other permanent structure in the vicinity of the luggage bin. A portion of the tether 84 is also secured to a manifold 98 to prevent the possibility of the manifold and/or conduit 82 falling behind and below the luggage bin 42 when the module 78 is removed. Removal of the electronics module 78 is accomplished by the user pulling on the tether in the direction of arrow 94, which causes the electronics module 78 to be withdrawn along the path defined by track 72 to a position where same can be easily grasped by the user. Re-insertion of the electronics module 78 into the fixture 70 is accomplished by the user initially urging the electronics module along the track 72 in the direction of arrow 96. As the electronics module 78 begins to pass behind the luggage bin 42, gravity urges it down into the fixture 70 where a coupling is made with the electrical cable 30. Thus, removal of the electronics module 78, as well as reinsertion of the electronics module 78 into the fixture 70, can be accomplished even without the user having visual access of any portion of the fixture 70. The use of the tether 84 also eliminates the possibility of the electronics cable 30 being lost behind the luggage bin 42.

With brief reference to FIG. 10, an alternative preferred track 100 is shown. In this embodiment, track 100 includes a pair of ledges 102 and a central opening 104. An electronics module 106 having a pair of oppositely extending flanges 108 is adapted to slide within the track 100. It will be appreciated that a wide range of different track shapes could be employed to perform the needed function of allowing the electronics module 78 or 106 to be guided into position into the fixture 70. Accordingly, the present invention is not limited to one specific form of track.

The various preferred embodiments of the present invention all provide for quick and easy removal and installation of an electronics module or other form of component into a fixture disposed in a generally difficult to access area of a structure or mobile platform. While the fixture of the present invention is particularly well suited for use on mobile platforms such as aircraft, it will be appreciated that the fixture can be employed in any difficult to access area which would otherwise require the removal of various components before an electronics module or other like component can be removed for service or testing.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A fixture adapted to be secured to a support surface for supporting a subcomponent and for enabling quick removal of said subcomponent therefrom and sliding insertion there into of said subcomponent, comprising:

a frame portion adapted to support said subcomponent in a manner that enables ready insertion of said subcomponent there into, and ready removal of said subcomponent therefrom without interfering with objects located adjacent to said frame;

said frame having at least one mounting component for enabling mounting of said frame to an external support structure; and said frame being operably associated with at least one of a cooling airflow conduit and an electrical signal cable to facilitate coupling thereto when said component is being supported by said frame portion.

2. The fixture of claim 1, wherein said fixture comprises a box-like structure into which said subcomponent can be inserted.

3. The fixture of claim 1, wherein said fixture comprises a latch mechanism for securing said subcomponent thereto.

4. The fixture of claim 2, wherein said fixture comprises at least one channel for cooperating with structure on said subcomponent to enable said subcomponent to be guided into said fixture during inserting of said subcomponent, and guided outwardly from said fixture during removal of said subcomponent.

5. The fixture of claim 1, wherein said fixture further comprises:

a cooling manifold secured thereto for directing a cooling airflow into said fixture.

6. The fixture of claim 1, wherein said mounting component comprises a plurality of mounting flanges for at least assisting in fixedly securing said fixture to said external structure.

7. The fixture of claim 1, wherein said fixture has a length suitable to support a plurality of said subcomponents thereon.

8. A fixture for supporting a box-like electronics module and for enabling quick removal of said electronics module therefrom and sliding insertion there into of said electronics module, comprising:

a box-like frame, said box-like frame being adapted to support said electronics module in a manner that enables ready insertion of said electronics module there into, and ready removal of said electronics module therefrom without interfering with objects located adjacent to said box-like frame;

said frame having a coupling for receipt of a cooling airflow conduit; and said frame having a plurality of mounting components for enabling mounting of said frame to an external support structure.

9. The fixture of claim 8, wherein said frame further comprises a manifold for interfacing said cooling airflow conduit with said frame to supply a cooling airflow to said electronics module.

10. The fixture of claim 8, wherein said frame comprises a cooling manifold secured thereto.

11. The fixture of claim 8, further comprising a track supported adjacent said external support structure for guiding said electronics module towards and into engagement with said frame.

12. The fixture of claim 8, further comprising a tether secured to said electronics module for enabling an operator to remotely direct said electronics module into engagement with said frame.

13. The fixture of claim 8, further comprising a latch operably associated with said frame and with said electronics module for releasably securing said electronics module to said frame.

14. The fixture of claim 8, wherein said frame further comprises a handle adapted to be grasped with at least one hand of a user.

15. The fixture of claim 8, wherein said frame comprises:
- a gasket for engaging a portion of said electronics module; and
- said airflow conduit operably coupled to said gasket and in air flow communication with said electronics module for supplying a cooling airflow to said electronics module.

16. A fixture for supporting an electronics module in a difficult to access area within a body structure of a mobile platform, said fixture comprising:
- a frame for supporting said electronics module;
- said frame having at least one mounting component for at least assisting in fixedly securing said frame to said body structure of said mobile platform;
- said frame having an opening wherein at least one of an external cooling airflow conduit and an electronics cable can be coupled to said electronics module; and
- wherein said frame enables said electronics module to be removed therefrom without disturbing external components mounted adjacent to said frame within said mobile platform.

17. The fixture of claim 16, further comprising:
- a track mounted adjacent said body structure of said mobile platform for guiding said electronics module into said frame.

18. The fixture of claim 16, further comprising:
- a tether secured to said electronics module for directing said electronics module along said track into said frame.

19. The fixture of claim 16, wherein said fixture has a length sufficient to support a plurality of independent electronic modules adjacent one another within said frame.

20. A method for supporting an electronics module adjacent a structural member to aid in enabling convenient and quick removal of said electronics module from an area that would otherwise be difficult to access and disassemble said electronics module from, said method comprising:
- securing a frame adjacent said structural member, said frame structure being adapted to receive said electronics module with a linear movement of said electronics module; and
- securing a cooling airflow conduit to said electronics module once said electronics module is positioned within said frame structure.

21. A method for supporting a subcomponent adjacent a structural member to aid in enabling convenient and quick removal of said subcomponent from an area that would otherwise be difficult to access and disassemble said subcomponent from, said method comprising:
- securing a support frame adjacent said structural member, said support frame being adapted to support thereon said subcomponent thereon;
- urging said subcomponent toward said support frame until said subcomponent engages said support frame and is supported at least in substantial amount by said support frame and until said subcomponent couples to a cooling airflow conduit; and
- coupling an electronics cable to said subcomponent.

22. The method of claim 21, further comprising:
- directing a cooling airflow into said airflow conduit to provide a cooling airflow to said subcomponent.

* * * * *